United States Patent [19]
Malcherczyk et al.

[11] Patent Number: 6,034,320
[45] Date of Patent: Mar. 7, 2000

[54] SUNSHINE ROOF PANEL FOR A VEHICLE

[75] Inventors: Joseph Malcherczyk, Gifhorn; Reinhard Walter, Leiferde; Fred Melzian, Kusey; Klaus Reimer, Gifhorn; Hans Gochermann, Holm; Werner Schwarz, Gelnhausen, all of Germany

[73] Assignee: Meritor Automotive GmbH, Frankfurt, Germany

[21] Appl. No.: 09/150,475

[22] Filed: Sep. 9, 1998

[30] Foreign Application Priority Data

Sep. 9, 1997 [DE] Germany .......................... 197 39 615

[51] Int. Cl.⁷ .................................................. H01L 25/00
[52] U.S. Cl. ............................................................ 136/251
[58] Field of Search .............................................. 136/251

[56] References Cited

U.S. PATENT DOCUMENTS 5,207,047  5/1993  Prignitz ..................................... 52/743
5,213,626  5/1993  Paetz ........................................ 136/244

FOREIGN PATENT DOCUMENTS 4105396  9/1992  Germany .
4323140  12/1994  Germany .

*Primary Examiner*—Mark Chapman
*Attorney, Agent, or Firm*—Howard & Howard

[57]  ABSTRACT

A roof panel incorporating a solar power generator, for a motor vehicle sunshine roof, has a foamed plastic frame around the edge of the panel and a plurality of crystalline solar cells forming a field of solar cells extending considerably into the region of the frame. Special precautions ensure that the crystalline solar cells, which are susceptible to breakage, are not damaged when foaming around the cover to form the frame. The solar cell field enables good use of solar energy and can be accommodated in a lightweight panel.

6 Claims, 6 Drawing Sheets

SUNSHINE ROOF PANEL FOR A VEHICLE

FIELD OF THE INVENTION

The present invention relates to a roof panel for a motor vehicle sunshine roof, and in particular, to such a roof panel incorporating a solar generator.

The term "sunshine roofs" is used herein as a generic term for all relevant known roof designs, namely sliding roofs with a merely sliding cover, slide and lift roofs with a sliding pivotal cover, and lifting roofs with a merely pivotal cover. So-called over-ridge roofs in which the cover slides over the fixed roof surface of the motor vehicle and, in some designs, is also pivotal (e.g. a spoiler roof), are also covered by the generic term.

BACKGROUND OF THE INVENTION

European Patent No. 0 221 287 B1 described a sunshine roof panel for a car in which solar cells are embedded in a resilient plastics material beneath a pane of glass. The sunshine roof has a curvature adapted to the aerodynamic shape of the vehicle, but the design of the edge region of the unit which integrates the solar generator into the sunshine roof construction is not described.

It is also known from German Patent Application No. 37 37 183 A1 to provide a solar generator for use in a sunshine roof of a car with a plastic frame produced by the RIM process (reaction injection molding process), a multi-component polyurethane elastomer being used as plastics material. In this arrangement, however, the solar cells are covered on both sides by a rigid panel, namely by a pane of glass at the top and by a pane of glass or a metal sheet at the bottom, so that the resulting roof panel becomes quite thick and heavy. These drawbacks must be allowed for when designing the actuating elements for the roof panel.

The same applies to a transparent sunshine roof panel with a solar unit described in German Patent No. 41 05 389 C1, in which the surface region located in the outer edge region of a transparent sheet is lined with more powerful, but non-transparent crystalline solar cells and, in a different surface region, with less powerful but transparent amorphous solar cells. This solar unit composed of various solar cells is enclosed between two panes of glass of which the outer edges are surrounded by a frame which can be formed as a polyurethane foam surround.

With known roof panels which are designed as solar generators and are already fitted in mass-produced cars such as the Audi A6 and A8, the internal surface of the roof panel, which is surrounded by a foamed plastic frame, accommodates crystalline solar cells. However, as the plastic frame has relatively wide frame parts, for reasons of strength and also to accommodate reinforcing profiles which may be required in the frame, only the internal framed region of the roof panel is available for accommodating crystalline solar cells, limiting the attainable utilization of solar energy.

The Applicant's attempts to accommodate crystalline solar cells in a generic solar generator, i.e. using a lightweight solar generator with a covering film on the underside, in the frame region and to incorporate them during foaming in order to achieve better use of solar energy have hitherto failed. The solar cells had a very high breakage rate during the foaming process.

SUMMARY OF THE INVENTION

The object of the invention is to provide a lightweight roof panel, designed as a solar generator, for motor vehicle sunshine roofs, which enables better use of solar energy.

According to the invention, the maximum surface area of the panel, i.e. the maximum free external surface of a pane of glass forming part of the panel, will accommodate crystalline solar cells so that a solar cell field of a maximum size, with external dimensions determined by the roof panel size, can be accommodated, and this enables the optimum production of energy from the panel. The resiliently embedded solar cells are covered with a film on their underside and are foamed around the edge in the outer edge region of the solar cell field with a foaming pressure which is comparatively low in comparison with conventional RIM foaming processes and preferably lower than 1 bar. The comparatively lower temperature accompanying this pressure very substantially eliminates the risk of breakage of and damage to the sensitive thin crystalline solar cells. This is assisted by the fact that the low pressure permits the use of flexible seals to limit the foaming region in the foaming mold in direct contact with the covering film and, therefore, also enables low mold closing forces.

To avoid compression of the solar cells by rigid profile bars foamed into the frame, the profile bars may be spaced from the unit formed from the glass pane, solar cells embedded in resilient matter, and the covering film.

To this end, spacers made of flexible material may be inserted between the profile bars and the unit. The spacers allow adequate spacing between the profile bars and the unit during all phases of frame molding without producing destructive pressure on the solar cells. The spacers are enclosed during the foaming process and, therefore, remain in the foam material of the frame.

In a further embodiment, lugs project from the frame after foaming. The lugs extend from opposing lateral profile bars which act upon functional parts of the panel actuating mechanism during installation of the panel into the sunshine roof and are used as elements for maintaining space between these profile bars and the unit during molding of the frame. Two other profile bars rest directly on the lateral profile bars supported by flanges so there are also spaces between the supported profile bars and the unit. With this design of the described spacing elements, the profile bars do not exert pressure on the unit or the sensitive solar cells, so special spacers are not required in the frame itself for this purpose.

BRIEF DESCRIPTION OF THE DRAWINGS

The above and other objects, features and advantages of the present invention will now be described in more detail with reference to the drawings in which.

DETAILED DESCRIPTION OF PREFERRED EMBODIMENTS

Figure 1:
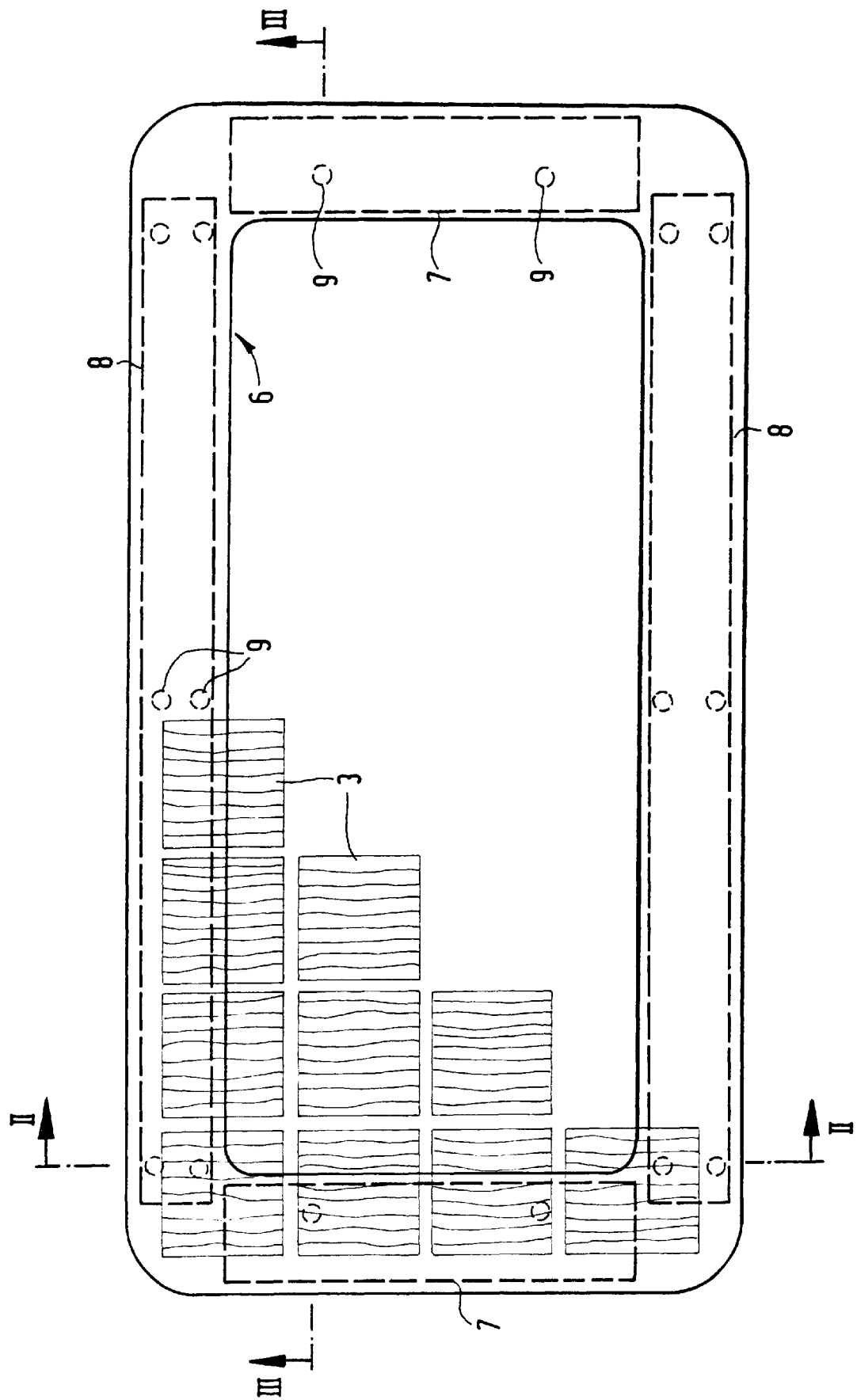
FIG. 1 is a plan view of a first embodiment of a roof panel, designed as a solar generator, for motor vehicle sunshine roofs, according to the present invention.

The roof panels shown in the two embodiments differ merely in the design of profile rods reinforcing the frame and the spacing thereof from the unit, so the cover construction for the two embodiments will first be described hereinafter with reference to FIGS. 1–3.

A pane of glass 1 carries, on its lower face, crystalline solar cells 3 embedded in a resilient plastics material 2. The resilient plastics material 2 originally consists of two separate films of hot melt adhesive composed, for example, of EVA (ethylene vinyl acetate) copolymer, between which the solar cells 3 are inserted. After temperature/vacuum treatment, the two films melt to form an embedding layer of the resilient plastics material 2 which adheres firmly to the lower face of the pane of glass 1 and is covered on its underside by a covering film or sheet 4.

The pane of glass 1, the resilient plastics material 2 with the solar cells 3 embedded therein, and the covering film 4, after being combined, form an integral unit 5 which may be stored in this form, transported, and finally provided with a frame described hereinafter for producing the roof panel, designed as a solar generator, for motor vehicle sunshine roofs.

The crystalline solar cells 3, which have a thickness of only about 0.1 to 0.3 mm and are very susceptible to breakage, can have respective surface dimensions of about 100×100 mm, for example. The individual cells are electrically interconnected and have a common connecting bushing (not shown) which is preferably accommodated in the frame of the cover described hereinafter.

Figure 5:
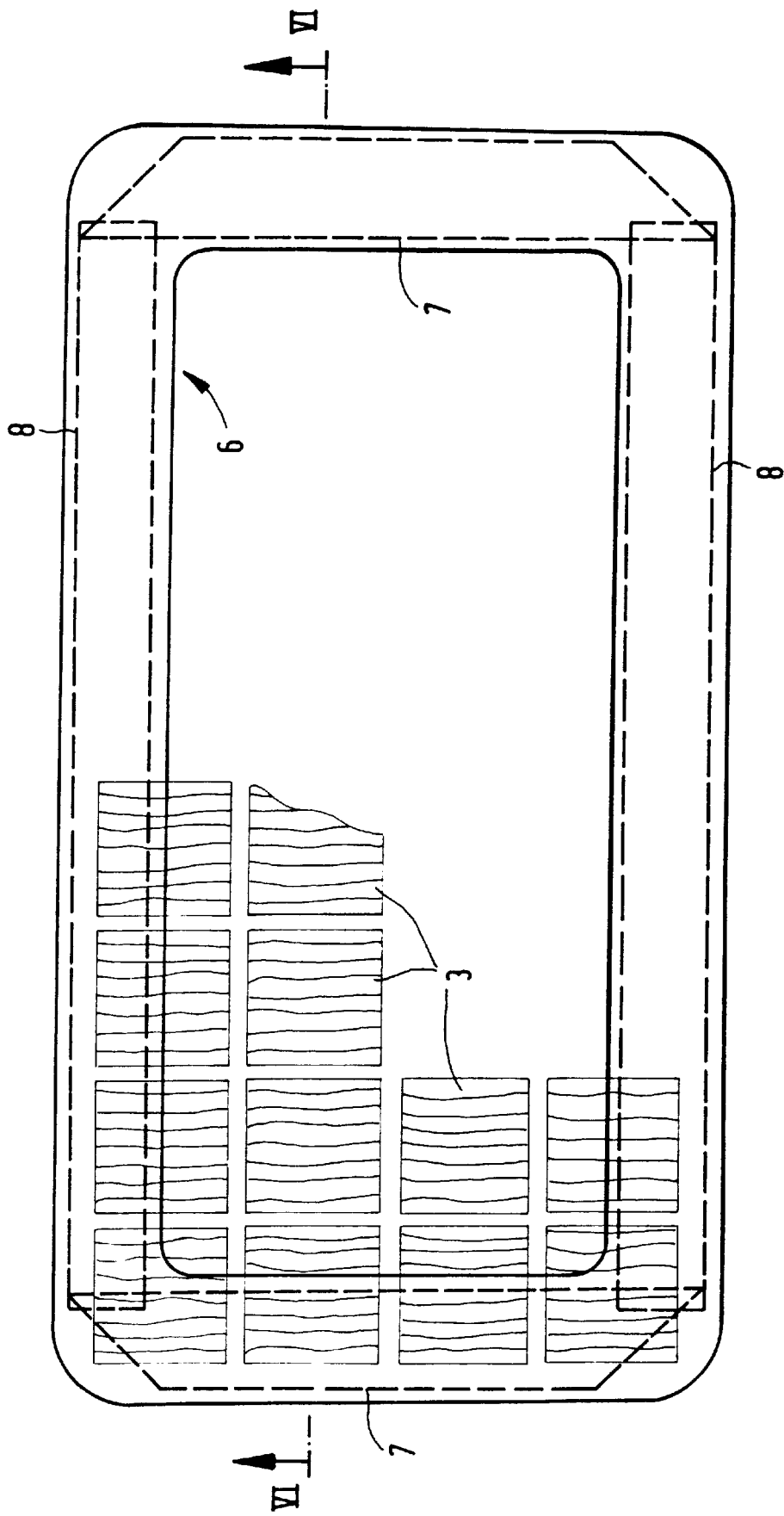
FIG. 5 is a plan view of a second embodiment of a roof panel, designed as a solar generator, for motor vehicle sunshine roofs, according to the present invention.

The solar cells 3, arranged in series with mutual spacing of about 2 to 5 mm, form a closed solar cell field, as illustrated in FIGS. 1 and 5 which show only a few of the solar cells 3 of the solar cell field. As also shown in the drawings, the solar cell field is only slightly smaller in its external dimensions than the free external surface of the pane of glass 1, so the external surface of the pane of glass 1 is very substantially backed by solar cells 3, so good utilization of energy can be achieved.

The roof panel has a frame 6, consisting of a plastics material and preferably based on polyurethane, which is injected or foamed onto the panel. As shown in FIGS. 1–3, the foamed frame 6 covers a considerable area of the outer edge region of the solar cell field from below. Damage to or destruction of the respective regions of the solar cell field can only be avoided if the pressures prevailing in the polyurethane material are very low during the injection molding or foaming process.

Figure 2:
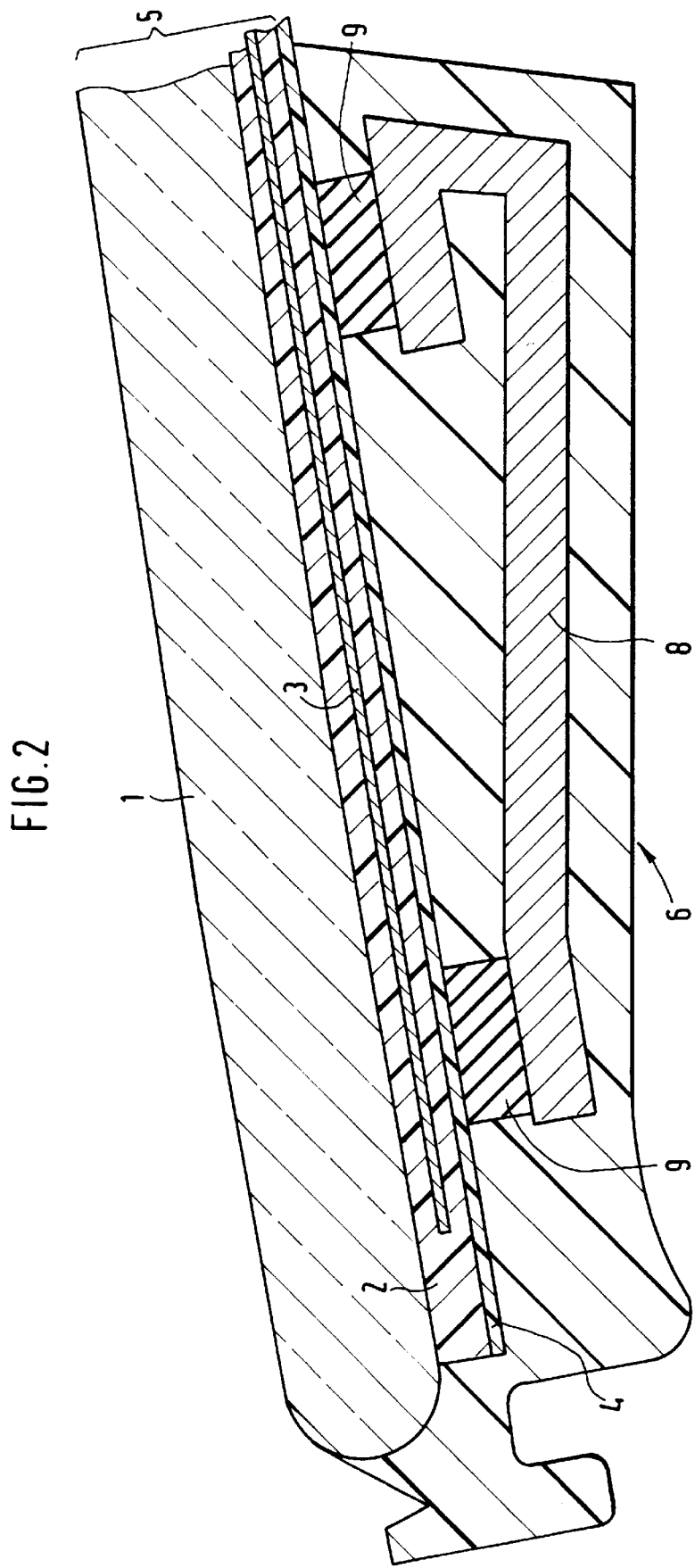
FIG. 2 is a broken away section through the panel along line II—II in FIG. 1.
Figure 3:
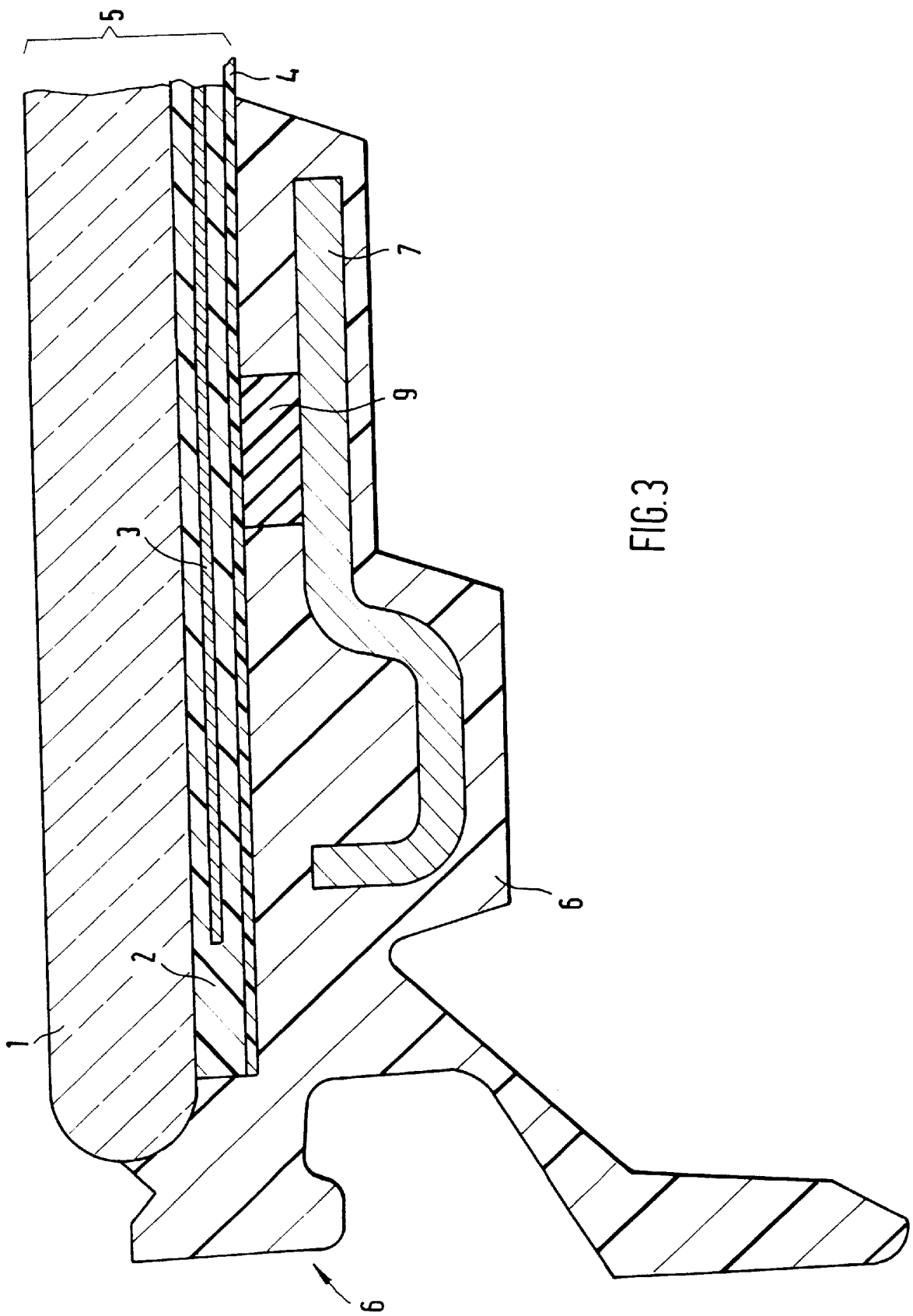
FIG. 3 is a broken away section through the panel along line III—III in FIG. 1.

As shown in FIGS. 2 and 3, the frame 6 is foamed only onto the underside of the cover and onto the outer edge of the pane of glass 1, so virtually the entire external surface of the pane of glass 1 is exposed at the top. The outer edge of the frame 6 has conventional undercut profiling for a sunshine roof peripheral seal (not shown). As normal with foamed frames of this type, the four frame parts are reinforced by matching pairs of foamed-in rigid profile bars 7 and 8. Owing to the susceptibility of the solar cells to breakage, which still exists in the unit 5, special precautions are taken to prevent the pressure of the profile bars 7 and 8 from destroying the unit 5. These precautions involve spacing the profile bars 7 and 8 from the unit 5 during application of the frame 6 and obviously also in the finished roof panel.

In the embodiment shown in FIGS. 1–4, this is effected by interposing spacer members 9 made of flexible material, for example of foam rubber or flexible polyurethane, between the mutually opposed faces of the unit 5 and the profile bars 7 and 8. The spacer members 9 rest on the covering film 4 from below and are attached to the profile bars 7 and 8, preferably by adhesion.

Figure 4:
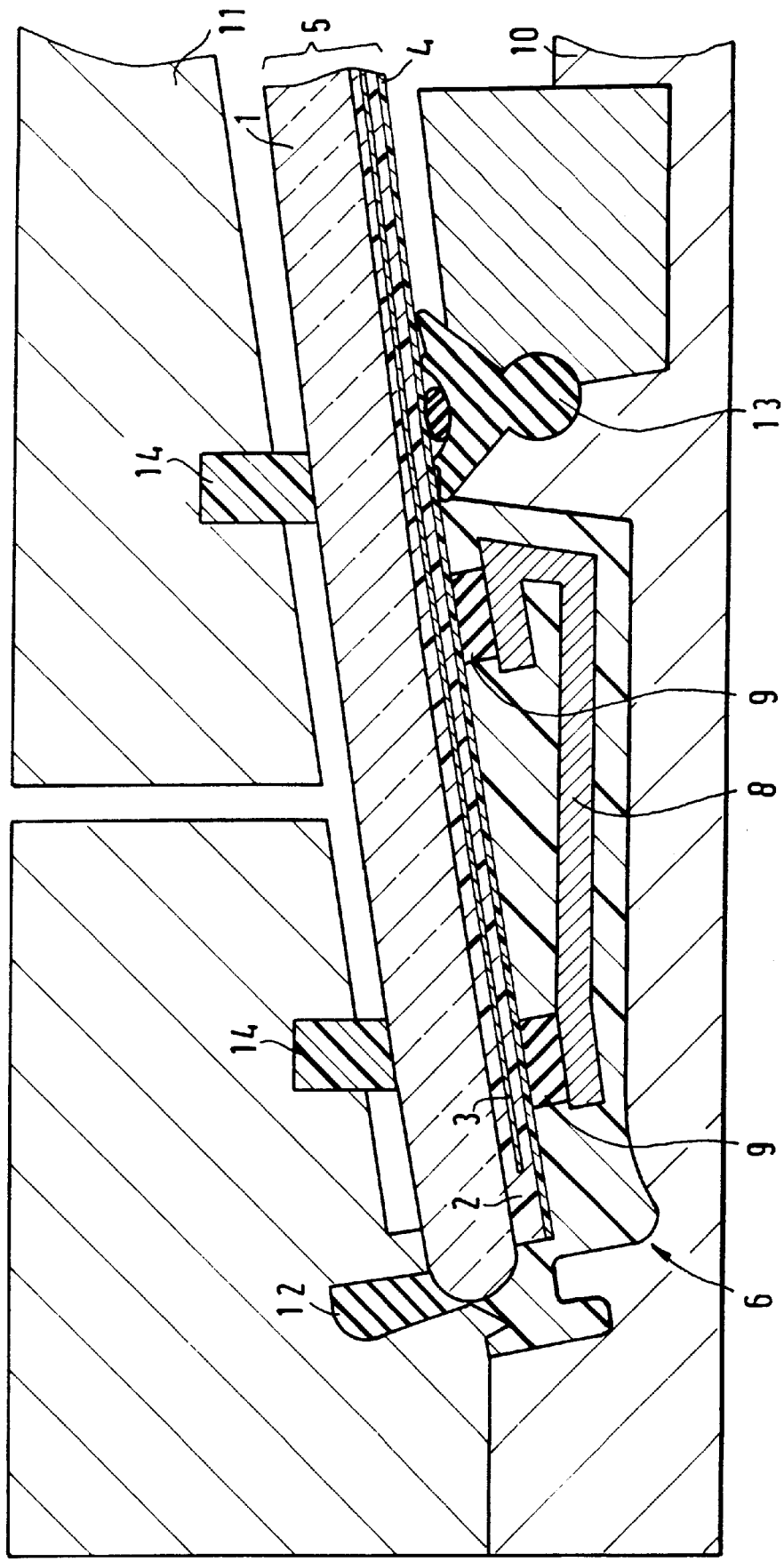
FIG. 4 is a broken away section corresponding to FIG. 2 through the panel and additionally through the mold for foaming a frame onto a cover.

FIG. 4 shows the molds, consisting of a lower part 10 and an upper part 11, for foaming of the frame 5 in the closed state. As the foaming pressure in the mold is low, the seals 12 and 13 used to limit the foaming region can also be made from a flexible material, for example foam rubber. Furthermore, the low foaming pressure also necessitates minimal mold closing forces so minimal forces have to be applied to the roof panel by the seals 12 and 13 and by contact strips 14 in the upper part 11 of the molds, ruling out damage to the sensitive solar cells. The specially structured seal 13 is designed in two parts in the example illustrated and consists of a larger sealing member in whose upper groove a foam seal which is circular in cross section in the undeformed state is inserted. The larger sealing member can have a Shore A hardness of 40 to 50 and the foam seal a Shore A hardness of about 30.

Figure 6:
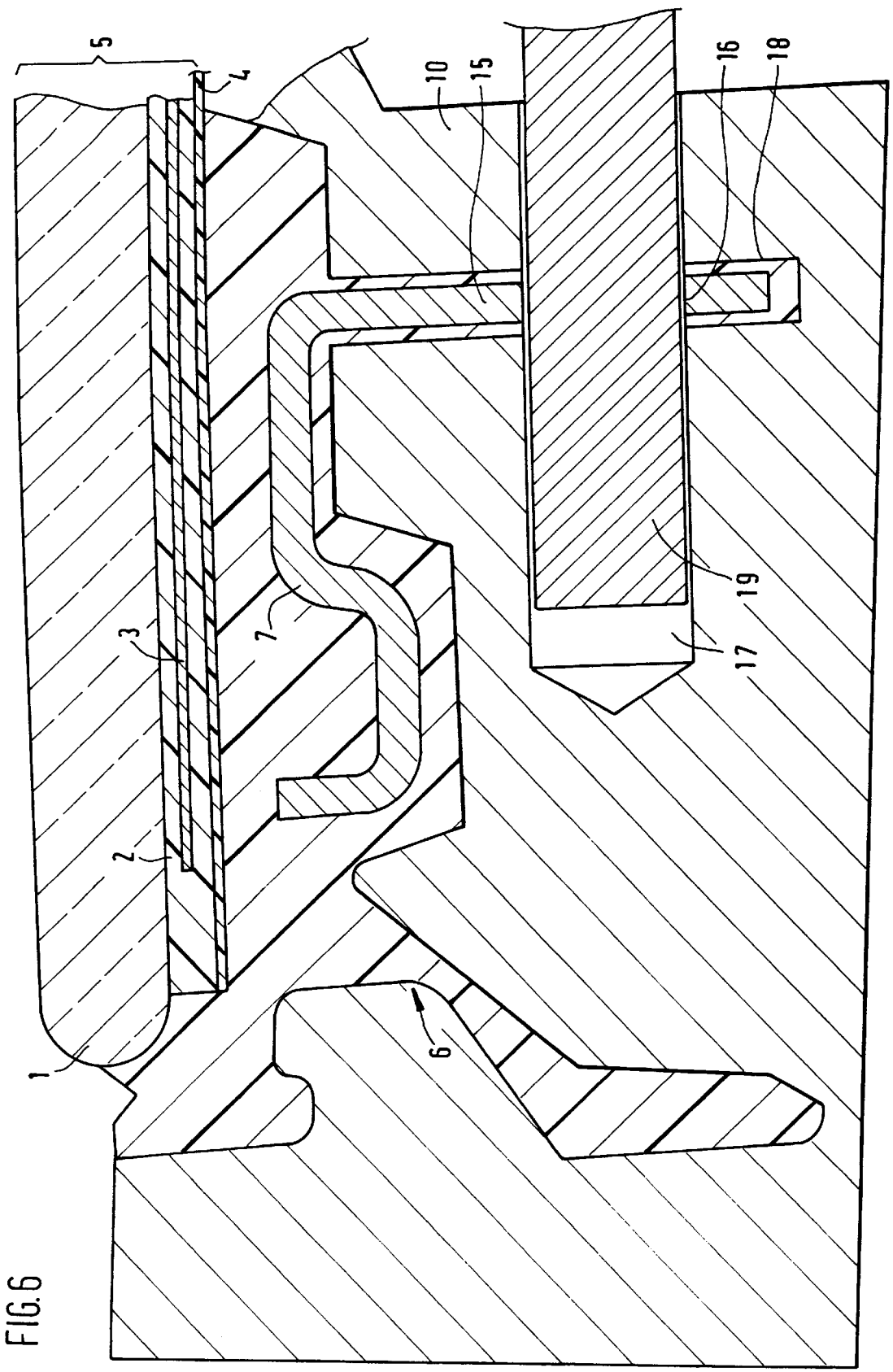
FIG. 6 is a broken away section through the panel and also through the lower part of the mold for foaming the frame onto the panel, along line VI—VI in FIG. 5.

Reference will now be made to FIGS. 5 and 6 to describe a roof panel according to a second embodiment of the invention. This incorporates elements which ensure the necessary spacing between the profile bars 7 and the unit 5. FIG. 6 shows the situation on one side of the roof panel which is also designed as a mirror image with respect to the mold on the other side. As shown in FIG. 6, the lateral profile bars 7 have downwardly directed lugs 15 which project downward from the finished frame 6. These lugs 15 have receiving holes 16 for studs and the like to be fitted during installation of the roof panel. These holes 16 in the profile bars 7 which already exist during insertion thereof into the mold are used for achieving the described spacing between the profile bars 7 and the unit 5. For this purpose, holes 17 which are aligned concentrically with a respective receiving hole 16 are arranged in the lower part 10 of the molds. The lugs 15 are received in corresponding recesses 18. The holes 17 pass transversely through the recesses 18. After insertion of the profile bars 7, a pin 19 is introduced into each hole 17, passing through the receiving hole 16 in the lug 15 so the profile bar 7 is held with the necessary spacing from the unit 5 via the lug 15. After molding of the frame, the pins 19 are removed so the roof panel can be released from the lower part 10 of the molds.

In the embodiment of FIGS. 5 and 6, the ends of the profile bars 7 and 8 overlap at the front and rear, so the profile bars 8 located in the roof panel at the front and rear are supported by the lateral profile bars 7 and are therefore also kept at a distance from the unit 5.

To sum up, the invention enables a roof panel designed as a solar generator for motor vehicle sunshine roofs with a foamed plastic frame in which a solar cell field penetrating into the frame with considerable surface regions is provided. Special precautions ensure that the crystalline solar cells which are susceptible to breakage are not damaged when foaming around the cover to form the frame. A large-area solar cell field which permits good utilization of energy with a lightweight panel design can therefore be accommodated.

It is very important for the frame to be foamed with a comparatively low foaming pressure. Whereas foaming pressures higher than 10 bar, normally 12 bar (high pressure process), are used when foaming covers by conventional RIM processes, frames according to the invention are foamed at very low pressures (low pressure process). The breakage rate among solar cells is comparatively low in the case of frames foamed at a pressure less than 1 bar. The frame can be foamed at a pressure as low as about 0.2 bar with excellent results.

The foregoing is illustrative of the principles of the invention. Modification and changes to the invention will readily occur to those skilled in the art, thus it is not desired to limit the invention to the embodiments shown and described. Accordingly modification and changes may be made as falling within the spirit and scope of the invention as defined by the claims.

What is claimed is:

1. A roof panel for a motor vehicle sunshine roof incorporating a solar power generator, comprising:
   (i) a pane of glass,
   (ii) a bed of resilient plastics material adhered beneath said pane of glass,
   (iii) a plurality of electrically interconnected crystalline solar cells embedded within said bed of resilient plastics material,
   (iv) and a covering sheet covering the underside of said resilient plastics material so that said pane, bed, cells and covering form a unit,
   (v) said cells extended in a field across the lower surface area of said pane of glass proximate to the circumscribing edge of said pane, and
   (vi) a frame of polyurethane based foam formed at a low foaming pressure around said circumscribing edge on the underside of said pane and covering the outer edge regions of said cell field.

2. A roof panel according to claim 1, wherein said frame is foamed at a pressure less than 1 bar.

3. A roof panel according to claim 1, including rigid profile bars spaced from said unit and foamed into said frame so as to reinforce said frame.

4. A roof panel according to claim 3 including spacers made of flexible material inserted between said profile bars and said unit.

5. A roof panel according to claim 3, wherein said profile bars include a first pair of laterally spaced profile bars having downwardly directed lugs projecting from said frame, said lateral profile bars spaced from said unit during said foaming by means of said lugs, and a second pair of profile bars resting with the ends of said second pair of said profile bars on adjacent ends of said lateral profile bars at the front and back of said roof panel.

6. A method of making a roof panel for a motor vehicle sunshine roof comprising:
   (a) the steps of providing a unit formed from a pane of glass to which is adhered resilient plastics material in which is embedded a plurality of electrically interconnected crystalline solar cells forming a cell field, the material having a covering sheet covering the exposed underside,
   (b) placing the unit in a mold, and
   (c) foaming at a low pressure a frame around the unit on the underside of the pane to cover the outer edge regions of the cell field.

* * * * *